United States Patent [19]

Ludwig et al.

[11] Patent Number: 5,680,063

[45] Date of Patent: Oct. 21, 1997

[54] BI-DIRECTIONAL VOLTAGE TRANSLATOR

[75] Inventors: Thomas Richard Ludwig, Streamwood; Richard Ng, Cary, both of Ill.

[73] Assignee: Motorola, Inc., Schaumburg, Ill.

[21] Appl. No.: 636,358

[22] Filed: Apr. 23, 1996

[51] Int. Cl.[6] .............................................. H03K 19/0185
[52] U.S. Cl. .............................. 326/80; 326/68; 326/119
[58] Field of Search ...................................... 326/68, 80–81, 326/112, 119, 83, 86

[56] References Cited

U.S. PATENT DOCUMENTS

| | | | |
|---|---|---|---|
| 4,982,113 | 1/1991 | Jinbo | 326/80 |
| 5,084,637 | 1/1992 | Gregor | 326/81 |
| 5,397,941 | 3/1995 | Merfil | 326/68 |
| 5,406,140 | 4/1995 | Wert et al. . | |
| 5,428,800 | 6/1995 | Hsieh et al. . | |

FOREIGN PATENT DOCUMENTS

| | | |
|---|---|---|
| 1551595 | 8/1979 | United Kingdom . |

OTHER PUBLICATIONS

Philips Semiconductors, Jul. 1994: Octal Dual Supply Transiating Transceiver; 3–State, 74 LVC4245, pp. 3–137–3–1542; 16–bit Bus Transciever With Direction Pin; 3–State, 74LVC16245, pp. 5–18–5–21.

U.S. Patent Application CE01288R–Ng et al, filed 3 Jan. 1996 by Motorola. Ser. No. 08/583,209.

*Primary Examiner*—Edward P. Westin
*Assistant Examiner*—Jon Santamauro
*Attorney, Agent, or Firm*—Randall S. Vaas; Mark D. Patrick

[57] ABSTRACT

A bi-directional voltage translator (102) includes a first port (300/302), a second port (302/300), and a switch circuit (310). The first port (300/302) communicates a first signal at a first voltage or a second voltage ($V_1/V_2$). The second port (302/300) communicates a second signal at the first voltage or a third voltage ($V_2/V_1$). The second and third voltages ($V_1/V_2$) are different. The switch circuit (310) is coupled to the first port (300/302) and the second port (302/300). The switch circuit (310), responsive to the first signal at the first voltage and the second signal at the third voltage ($V_2,V_1$), communicates to the second port (302/300) the second signal at the first voltage. The switch circuit (310), responsive to the second signal at the first voltage and the first signal at the second voltage ($V_1/V_2$), communicates to the first port (300/302) the first signal at the first voltage.

20 Claims, 3 Drawing Sheets

5,680,063

BI-DIRECTIONAL VOLTAGE TRANSLATOR

FIELD OF THE INVENTION

The present invention relates generally to voltage translators and, more specifically, to a voltage translator that is bi-directional.

BACKGROUND OF THE INVENTION

Electronic systems employ voltage translators to interface electronic devices that operate at different voltage levels. Such voltage translators are sometimes bi-directional to facilitate transferring of data. Some existing bi-directional voltage translators require a read/write control line to control the direction of data communication. The read/write control line is controlled by one of the electronic devices coupled to the bi-directional voltage translator. However, hardware limitations prevent existing electronic devices, which do not include control circuitry to communicate with a read/write control line, from being readily retrofit to communicate with the read/write control line. Also, connectors and cabling for these existing devices does not accommodate the read/write control line.

Existing bi-directional voltage translators also consist of numerous electrical components that require packaging in a relatively large housing. These large housings can be difficult for mobile users to store and carry. Additionally, these translators must be mechanically coupled to the electronic devices with which they are used via cabling. Such cabling may be permanently mounted to the translator housing or fit with connectors that detachably mate with connectors on the translator housing. Users often desire to transport the bi-directional voltage translator along with their electronic device in anticipation of interfacing with devices at different locations, such as at home, work, or while traveling. However, the sizable housing and extensive cabling makes storage difficult without significantly increasing the size of the bags used to transport the devices, the translator, and the cabling.

What is needed, therefore, is a bi-directional voltage translator that does not utilize a read/write control line and that comprises only a minimal number of electrical components so as to be portable.

It is also beneficial to implement a bi-directional voltage translator using a low cost, "off-the-shelf" component.

DETAILED DESCRIPTION OF THE PREFERRED EMBODIMENTS

A bi-directional voltage translator comprises a first port, a second port, and a switch circuit. The first port communicates a first signal at a first voltage level or a second voltage level. The second port communicates a second signal at the first voltage level or a third voltage level. The second and third voltage levels are different. The switch circuit is coupled to the first port and the second port. The switch circuit, responsive to the first signal (via the first port) at the first voltage level and the second signal at the third voltage level, communicates to the second port the second signal at the first voltage level. The switch circuit, responsive to the second signal (via the second port) at the first voltage level and the first signal at the second voltage level, communicates to the first port the first signal at the first voltage level.

Figure 1:
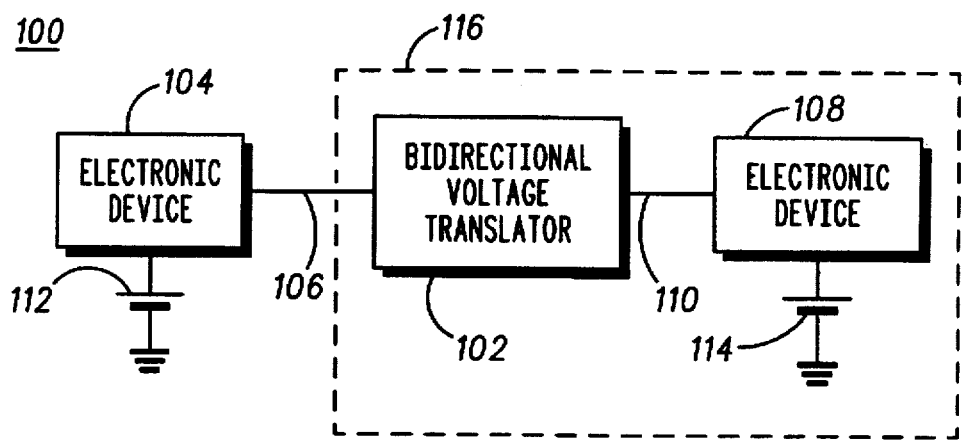
FIG. 1 illustrates an electronic system employing electronic devices and a bi-directional voltage translator.

FIG. 1 illustrates electronic system 100 employing bi-directional voltage translator 102. Electronic system 100 also includes electronic device 104, bus 106, electronic device 108, and bus 110. Electronic device 104 operates at a first voltage level provided by battery 112 coupled thereto. Electronic device 104 is coupled to bi-directional voltage translator 102 by bus 106. Electronic device 108 operates at a second voltage level provided by battery 114 coupled thereto. In the illustrated embodiment, the first voltage level is different from the second voltage level. Electronic device 108 is coupled to bi-directional voltage translator 102 by bus 110. Each one of electronic devices 104 and 108 can be any one of a plurality of electronic devices including a cellular radiotelephone, a cellular base station, a landline telephone, a two-way radio, a pager, a personal digital assistant, a computer, a modem, a Personal Computer Memory Card International Association (PCMCIA) card, a subscriber identity module (SIM) card, a SIM card reader, a smart card, a smart card reader, a battery charger, or the like, and "device" as used herein refers to each of these and their equivalents.

Figure 3:
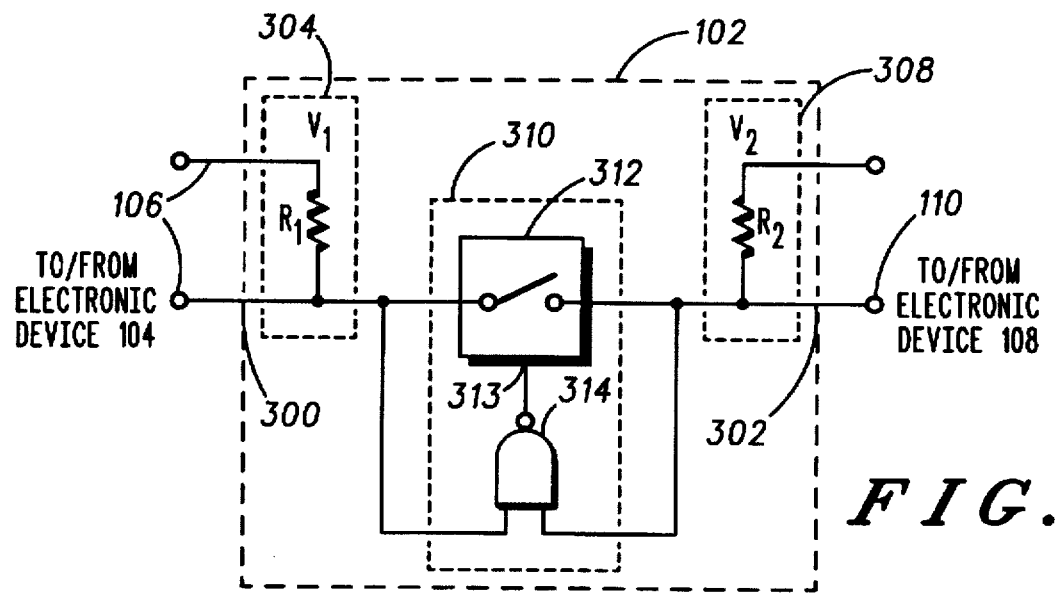
FIG. 3 illustrates a logical diagram of the bi-directional voltage translator of FIG. 1.
Figure 2:
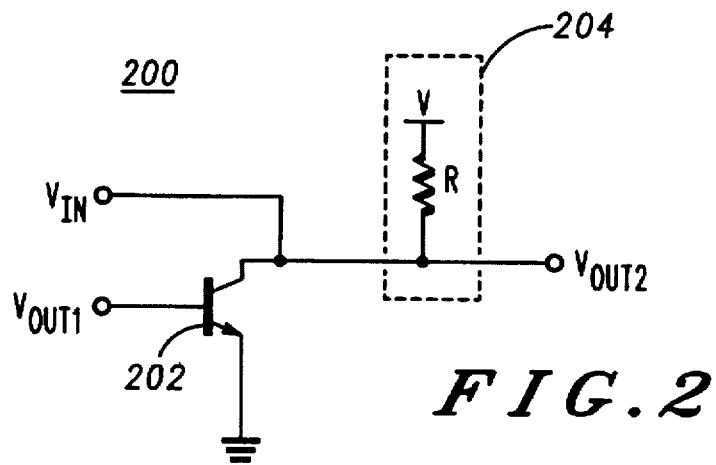
FIG. 2 illustrates a circuit diagram of an output port employed by each of the electronic devices of FIG. 1.

Electronic devices 104 and 108 include a communication driver 200 shown in FIG. 2. Communication driver 200 includes transistor 202 and pull-up circuit 204. Transistor 202 is employed in an open-collector configuration and includes a base coupled to a first output terminal, $V_{OUT1}$, an emitter coupled to electrical ground, and a collector coupled to both an input terminal, $V_{IN}$, and a second output terminal, $V_{OUT2}$. Pull-up circuit 204 includes power supply V serially coupled to resistor R. Power supply V operates at the first voltage level provided by battery 112 of electronic device 104 or the second voltage level provided by battery 114 of electronic device 108. Pull-up circuit 204 is coupled to $V_{OUT2}$. $V_{OUT2}$ of communication driver 200 of electronic devices 104 and 108 is further coupled to buses 106 and 110, respectively. When electronic device 104 or 108 sets $V_{OUT1}$ to a logic-low voltage level, pull-up circuit 204 sets $V_{OUT2}$ to the voltage level of power supply V, a logic-high signal. The logic-high signal is communicated on bus 106 by electronic device 104 at a first voltage level and communicated on bus 110 by electronic device 108 at a second voltage level. The logic-high signal communicated on bus 106 or bus 110 is monitored by electronic device 104 or 108, respectively, at $V_{IN}$. When electronic device 104 or 108 sets $V_{OUT1}$ to a logic-high voltage level, $V_{OUT2}$ is driven from the voltage level of V to ground or 0 V, and a logic-low signal is communicated on bus 106 or 110, respectively. The logic-low signal communicated on bus 106 or bus 110 is monitored by electronic device 104 or 108, respectively, at $V_{IN}$. Although transistor 202 is shown and described as a BJT (Bipolar Junction Transistor) in an open-collector configuration, communication driver 200 could alternatively be implemented using a FET (Field Effect Transistor) in an open drain configuration or other suitable device. Although described and shown to be disposed in electronic devices 104 and 108, pull-up circuit 204 could alternatively be disposed in bi-directional voltage translator 102 as shown in FIG. 3.

Electronic devices 104 and 108 communicate the logic-high and logic-low signals on buses 106 and 110, respectively, according to compatible protocols. Such protocols are known, and allow for detection and recovery of communication signals following collisions by signals traveling simultaneously in both directions in a common medium.

Bi-directional voltage translator 102 receives the logic-high and logic-low signals communicated on buses 106 and 110 by electronic devices 104 and 108, respectively. The logic-high signal at the first voltage level received from electronic device 104 via bus 106 is converted by bi-directional voltage translator 102 into the logic-high signal at the second voltage level on bus 110. The logic-low signal received from electronic device 104 via bus 106 is communicated by bi-directional voltage translator 102 to bus 110. These signals on bus 110 are detected by electronic device 108. The logic-high signal at the second voltage level received from electronic device 108 via bus 110 is converted by bi-directional voltage translator 102 into the logic-high signal at the first voltage level on bus 106. The logic-low signal received from electronic device 108 via bus 110 is communicated by bi-directional voltage translator 102 to bus 106. These signals on bus 106 are detected by electronic device 104.

Bi-directional voltage translator 102, bus 110, and electronic device 108 could be commercially packaged to provide an accessory, such as accessory 116, for use with electronic device 104. In FIG. 1, the electronic circuitry comprising accessory 116 is illustrated as electronic device 108 and operates at the second voltage level provided by battery 114. Accessory 116 is detachably coupled to electronic device 104 via bus 106. Accessory 116 could be a vehicle accessory, such as a hands-free accessory for a cellular radiotelephone, a data accessory, such as a modem or a PCMCIA card, or other equivalent accessory.

Field service of one of electronic devices 104 and 108 can be accomplished via electronic system 100. For example, electronic system 100 could be used to transfer cellular radiotelephone system identification and operation data (Electronic Serial Number (ESN) and/or Number Assignment Module (NAM) data) from electronic device 104, which is a cellular radiotelephone that must be repaired, to electronic device 108, which is a loaner cellular radiotelephone, via bi-directional voltage translator 102. Electronic system 100 could be used to program such cellular radiotelephone system identification and operation data from electronic device 104, which is a computer or dedicated programming box, to electronic device 108, which is a cellular radiotelephone, via bi-directional voltage translator 102. Electronic system 100 could also be used to test the operation of electronic device 104 by coupling electronic device 108, which could be an individual piece or entire rack of test equipment, via bi-directional voltage translator 102.

A logical representation of bi-directional voltage translator 102 is illustrated in FIG. 3. Bi-directional voltage translator 102 comprises ports 300 and 302, pull-up circuits 304 and 308, and switch circuit 310. Ports 300 and 302 are coupled to buses 106 and 110, respectively. Pull-up circuits 304 and 308 are coupled to ports 300 and 302, respectively. Pull-up circuits 304 and 308 comprise respective power supplies $V_1$ and $V_2$ serially coupled to respective resistors $R_1$ and $R_2$. Power supplies $V_1$ and $V_2$ are provided by batteries 112 and 114 of electronic devices 104 and 108 that are connected to bi-directional voltage translator 102 via wires of buses 106 and 110, respectively. Alternatively, power supplies $V_1$ and $V_2$ could be provided by a power supply that is independent of electronic devices 104 and 108. Although described and shown as part of bi-directional voltage translator 102, pull-up circuit 304 could alternatively be disposed within electronic device 104 and/or pull-up circuit 308 could alternatively be disposed within electronic device 108 as shown in FIG. 2.

Switch circuit 310 includes switch 312 and NAND gate 314. Switch 312 is operatively coupled between ports 300 and 302. Switch 312 includes control port 313. Switch 312, responsive to reception of a logic-high signal at control port 313, is closed and connects port 300 to port 302. Switch 312, responsive to reception of a logic-low signal at control port 313, is opened and disconnects port 300 from port 302. NAND gate 314 includes inputs coupled to ports 300 and 302, and an output coupled to control port 313 of switch 312. NAND gate 314 generates a logic-high signal at its output when a logic-low signal is present at one or both of its inputs. NAND gate 314 generates a logic-low signal at its output when a logic-high signal is present at both inputs.

In operation, pull-up circuit 304 sets the voltage level at port 300 to $V_1$, a logic-high signal, when a logic-low signal is not present at port 300. The logic-high signal of $V_1$ is communicated on bus 106 to electronic device 104. The logic-high signal is received by electronic device 104 via $V_{IN}$ of communication driver 200 of FIG. 2. Pull-up circuit 308 sets the voltage level at port 302 to $V_2$, another logic-high signal, when a logic-low signal is not present at port 302. The logic-high level of $V_2$ is communicated on bus 110 to electronic device 108. The logic-high signal is received by electronic device 108 via $V_{IN}$ of communication driver 200. The logic-high signals at ports 300 and 302 cause NAND gate 314 to open switch 312 as shown in FIG. 3. When electronic device 104 drives the voltage level at port 300 to the logic-low level via communication driver 200 and thereby communicates a logic-low signal, NAND gate 314 closes switch 312. The logic-low signal is communicated to electronic device 108 via port 302 and bus 110. The logic-low signal is received by electronic device 108 via $V_{IN}$ of communication driver 200. When electronic device 108 drives the voltage level at port 302 to the logic-low level via communication driver 200 and thereby communicates a logic-low signal, NAND gate 314 closes switch 312. The logic-low signal is then communicated to electronic device 104 via port 300 and bus 106. The logic-low signal is received by electronic device 104 via $V_{IN}$ of communication driver 200. As previously stated, a common protocol allows detection of, and recovery from, collisions when electronic devices 104 and 108 drive respective ports 300 and 302 to the low-voltage level simultaneously. As such, bi-directional voltage translator 102 allows electronic devices 104 and 108 to communicate over wires of buses 106 and 110 that, together, form a single bi-directional wire, without using a separate direction control line to the translation, such as a translation read/write control line.

Figure 4:
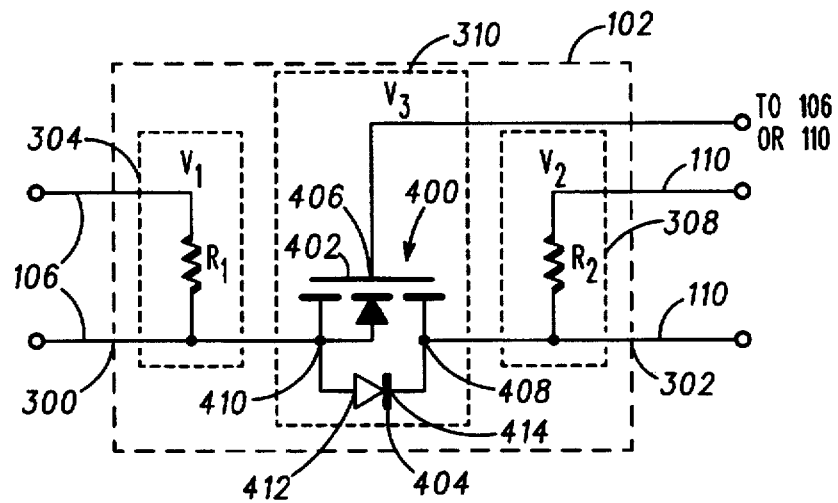
FIG. 4 illustrates a circuit schematic of an alternate embodiment of the bi-directional voltage translator of FIG. 1.

A translator circuit of bi-directional voltage translator 102 is illustrated in FIG. 4. Switch circuit 310 comprises transistor device 400. Transistor device 400 includes transistor 402 and diode 404. Transistor 402 includes terminals comprising gate 406, drain 408, and intercoupled body and source 410. Gate 406 is coupled to power supply $V_3$, which is preferably powered by connection to the lower one of power supplies $V_1$ and $V_2$. Drain 408 is coupled to port 302. Source 410 is coupled to port 300, which is preferably connected to the one of electronic devices 104 and 108 that operates at the lower voltage level. Diode 404 includes anode 412 and cathode 414. Anode 412 is coupled to source 410. Cathode 414 is coupled to drain 408. Transistor device 400 is preferably an N-Channel Enhancement Mode type MOSFET (metal-oxide semiconductor field effect transistor). Such MOSFETs typically include intrinsic diode 404. In the illustrated embodiment, transistor device 400 is a single MOSFET that bridges, in a Common-Gate configuration, logic-high signals of different maximum voltages communicated by ports 300 and 302.

Transistor device 400 remains in an "off" state when logic-high signals are being communicated to electronic devices 104 and 108 via pull-up circuits 304 and 308, respectively, as previously discussed in reference to FIG. 3. In the "off" state, transistor 402 does not conduct. When electronic device 104 drives the voltage level at port 300 to the logic-low level, as described in FIGS. 2 and 3, while port 302 is communicating at the logic-high level, transistor device 400 turns "on". Transistor 402 conducts and saturates, thereby driving port 302 to the logic-low level. As such, transistor device 400 translates the logic-high signal at port 302 to the logic-low signal when the logic-low signal is communicated at port 300. When electronic device 108 drives the voltage level at port 302 to the logic-low level, as described in FIGS. 2 and 3, while port 300 is communicating at the logic-high level, transistor device 400 turns "on". Diode 404 conducts and pulls the voltage level at source 410 low to approximately 0.7 V. In the illustrated embodiment, the gate-to-source threshold voltage of transistor 402 is less than or equal to $V_3$–0.7 V. This allows transistor 402 to conduct and eventually saturate when diode 404 conducts and, thereby, drive port 300 to the logic-low level. As such, transistor device 400 translates the logic-high signal at port 300 to the logic-low signal when the logic-low signal is communicated at port 302. By disposing pull-up circuits 304 and 308 in electronic devices 104 and 108, respectively, as previously suggested, bi-directional voltage translator 102 may be reduced to a single transistor. The single transistor can be packaged together with the buses in a single cable, thereby increasing portability of bi-directional voltage translator 102 and eliminating the need for separate packaging for bi-directional voltage translator 102.

Figure 5:
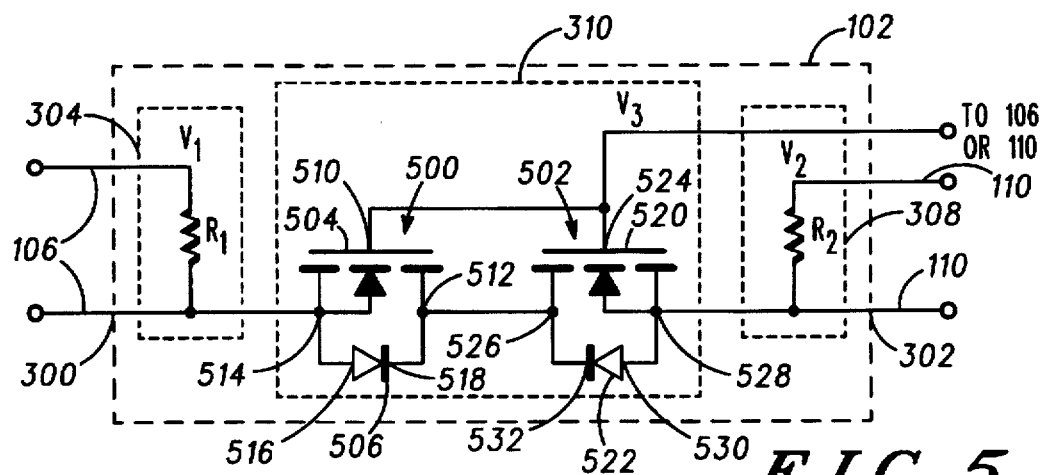
FIG. 5 illustrates a circuit schematic of another alternate embodiment of the bi-directional voltage translator of FIG. 1.

An alternate embodiment of bi-directional voltage translator 102 is shown in FIG. 5. Switch circuit 310 employs two transistor devices, 500 and 502. Each of transistor devices 500 and 502 are substantially similar to transistor device 400 of FIG. 4. Transistor device 500 includes transistor 504 and diode 506. Transistor 504 includes gate 510, drain 512, and an intercoupled body and source 514. Gate 510 is coupled to power supply $V_3$. Drain 512 is coupled to transistor device 502. Source 514 is coupled to port 300. Diode 506 includes anode 516 and cathode 518. Anode 516 is coupled to source 514. Cathode 518 is coupled to drain 512. Transistor device 502 includes transistor 520 and diode 522. Transistor 520 includes gate 524, drain 526, and an intercoupled body and source 528. Gate 524 is coupled to power supply $V_3$. Drain 526 is coupled to transistor device 500. Source 528 is coupled to port 302. Diode 522 includes anode 530 and cathode 532. Anode 530 is coupled to source 528. Cathode 532 is coupled to drain 526.

Transistor devices 500 and 502 remain in an "off" state when logic-high signals are being communicated to electronic devices 104 and 108 via pull-up circuits 304 and 308, respectively, as previously discussed in reference to FIG. 3. In the "off" state, transistor devices 500 and 502 do not conduct. When electronic device 104 drives the voltage level at port 300 to the logic-low level, as described in FIGS. 2 and 3, while port 302 is at the logic-high level, transistor device 500 turns "on". Transistor 504 conducts and saturates, thereby driving drain 526 of transistor device 502 to the logic-low level. Diode 522 of transistor device 502 conducts and pulls the voltage level at source 528 low to approximately 0.7 V. In the illustrated embodiment, the gate-to-source threshold voltage of transistor 520 of transistor device 502 is less than or equal to $V_3$–0.7 V. This allows transistor 520 to conduct and eventually saturate when diode 522 conducts and, thereby, drive port 302 to the logic-low level. As such, transistor devices 500 and 502 translate the logic-high signal at port 302 to the logic-low signal when the logic-low signal is communicated at port 300.

When electronic device 108 drives the voltage level at port 302 to the logic-low level, as described in FIGS. 2 and 3, while port 300 is at the logic-high level, transistor device 502 turns "on". Transistor 520 conducts and saturates, thereby driving drain 512 of transistor device 500 to the logic-low level. Diode 506 of transistor device 500 conducts and pulls the voltage level at source 514 low to approximately 0.7 V. In the illustrated embodiment, the gate-to-source threshold voltage of transistor 504 of transistor device 500 is less than or equal to $V_3$–0.7 V. This allows transistor 504 to conduct and eventually saturate when diode 506 conducts and, thereby, drive port 300 to the logic-low level. As such, transistor devices 500 and 502 translate the logic-high signal at port 300 to the logic-low signal when the logic-low signal is communicated at port 302. One skilled in the art will recognize that the arrangement of transistor devices 500 and 502 in FIG. 5 and, particularly, the arrangement of diodes 506 and 522, provides isolation of port 300 from port 302 when power supply $V_3$ is not powered.

In FIGS. 4 and 5, if bi-directional voltage translator 102 is a 3 V to 5 V translator, suitable values for power supplies $V_1$, $V_2$, and $V_3$ are 3 V, 5 V, and 3 V, respectively, and a suitable value for resistors $R_1$ and $R_2$ is 15 k $\Omega$. It will be recognized that other values for resistors $R_1$ and $R_2$ can be used.

Figure 6:
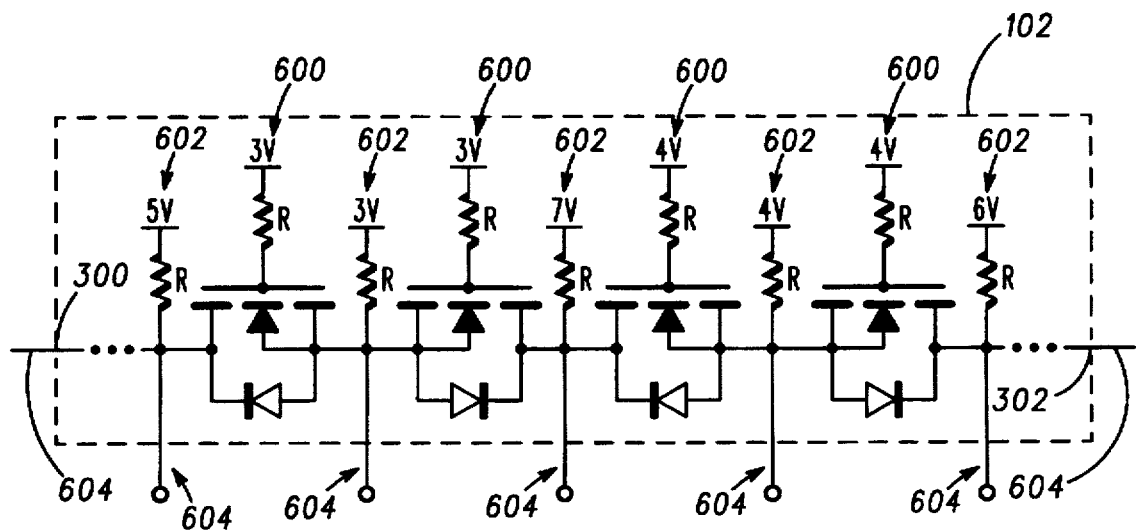
FIG. 6 illustrates a circuit schematic of yet another alternate embodiment of the bi-directional voltage translator of FIG. 1.

FIG. 6 illustrates that bi-directional voltage translator 102 could alternatively consist of several ones of transistor device 400, denoted by 600, and several ones of pull-up circuit 304 having different power supply voltages, denoted by 602, coupled in series. Several ones of buses 106 and 110, denoted by 604, are coupled to the several pull-up circuits 602. Each transistor device of the several transistor devices 600 is connected between both a pair of pull-up circuits of the several pull-up circuits 602 that provide different logic-high levels and a pair of buses of the several buses 604. Specifically, the source of each transistor device of the several transistor devices 600 is connected to the pull-up circuit of the pair of pull-up circuits of the several pull-up circuits 602 that provides the smaller of the two logic-high levels. The drain of each transistor device of the several transistor devices 600 is connected to the pull-up circuit of the pair of pull-up circuits of the several pull-up circuits 602 that provides the greater of the two logic-high levels. Such connection creates a translator that is compatible with a wide array of electronic devices, each operating at a different voltage level and each connected to the translator via one of the several buses 604.

Figure 7:
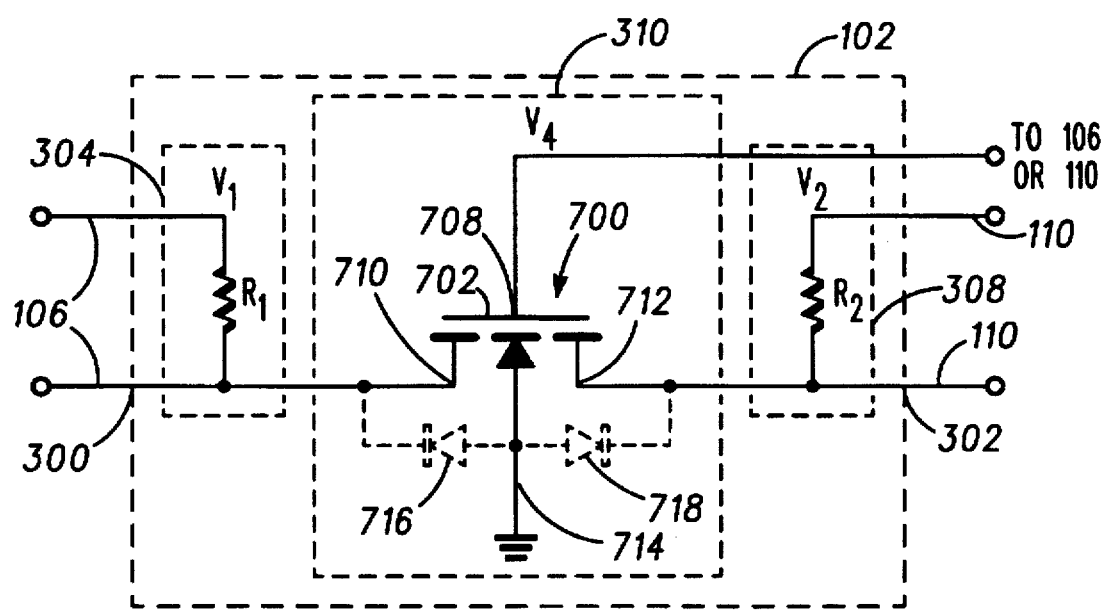
FIG. 7 illustrates a circuit schematic of even yet another alternate embodiment of the bi-directional voltage translator of FIG. 1.

Another alternate embodiment of bi-directional voltage translator 102 is shown in FIG. 7. Switch circuit 310 employs transistor device 700. Transistor device 700 includes transistor 702. Transistor 702 includes gate 708, drain 710, source 712, and body 714. Gate 708 is connected to power supply $V_4$, which is preferably powered by connection to the lower one of power supplies $V_1$ and $V_2$. Drain 710 is connected to port 300. Source 712 is connected to port 302. In the illustrated embodiment, the gate-to-source threshold voltage of transistor 702 is lower than $V_4$. Transistor 702 is preferably a MOSFET that is manufactured, for example, in an integrated circuit or four-terminal device package, to allow a separate connection to body 714. Body 714 is connected to electrical ground, thereby making drain 710 and source 712 behave substantially identically. Unlike the embodiments of FIGS. 3-6, source 712 need not be coupled to the one of ports 300 and 302 that is pulled up by pull-up circuits 304 and 308 to the larger one of $V_1$ and $V_2$. Thus, drain 710 may be connected to port 302 and source 712 may be connected to port 300. Manufacture of transistor device 700 results in inherent diodes 716 and 718, shown in dotted line. Inherent diode 716 is coupled between body 714 and drain 710. Inherent diode 718 is coupled between body 714 and source 712. Transistor device 700 isolates port 300 from port 302 when power supply $V_4$ is not powered. In operation, if one of port 300 and 302 is driven to the logic-low level (while the other one of port 300 and 302 is communicating at the logic-high level), transistor 702 of transistor device 700 conducts and drives the other one of port 300 and 302 to the logic-low level.

Although switch circuit 310 of bi-directional voltage translator 102 has been implemented using one or more MOSFET devices, one skilled in the art will recognize that alternative transistor devices, such as BJTs, may be used. However, BJTs require a comparatively higher turn-on current than MOSFET devices. In low power applications, such as 3 V to 5 V voltage translation, it is envisioned that the use of BJTs rather than MOSFETs may retard or altogether prevent turn-on of switch circuit 310.

Bi-directional voltage translator 102 has been illustrated in FIGS. 1-7 as drawn to a single bi-directional wire of buses 106 and 110. It will be recognized that the above implementations are compatible with buses employing multiple wires for communication of these signals, such as the three-wire bus utilized in radiotelephone products manufactured and sold by Motorola, Inc. For more than one wire, the entire embodiment of FIGS. 2-7 is replicated for each additional communication wire of a multiple wire bus. That is, each additional wire requires a single transistor device and two pull-up circuits.

Therefore, a bi-directional voltage translator can be implemented that allows two electronic devices with incompatible voltage levels to communicate over a single bi-directional wire without using a separate directional control line. This allows the bi-directional voltage translator to be utilized without adding additional wires to existing cabling or additional hardware to electronic devices. The bi-directional voltage translator operates at a low power level and can be implemented using a single "off-the-shelf" transistor. As such, the cost of the bi-directional voltage translator is minimized. Portability of the bi-directional voltage translator is increased as the single transistor (with or without the pull-up-circuits) can be packaged along with the buses in a single cable, thereby eliminating the need to package the bi-directional voltage translator is a housing separate from the buses.

What is claimed is:

1. A bi-directional voltage translator comprising:
   a first port to communicate a first signal at one of a first voltage level and a second voltage level;
   a second port to communicate a second signal at one of the first voltage level and a third voltage level, the third voltage level different from the second voltage level; and
   a switch circuit operably coupled to the first port and the second port, the switch circuit, responsive to the first signal at the first voltage level and the second signal at the third voltage level, communicating to the second port the second signal at the first voltage level, and the switch circuit, responsive to the second signal at the first voltage level and the first signal at the second voltage level, communicating to the first port the first signal at the first voltage level.

2. A bi-directional voltage translator according to claim 1 wherein the switch circuit comprises a first terminal, a second terminal, and a third terminal, the first terminal coupled to the first port, the second terminal coupled to the second port, and the third terminal coupled to a first power supply operating at the second voltage level.

3. A bi-directional voltage translator according to claim 1 wherein the switch circuit consists of a FET device.

4. A bi-directional voltage translator according to claim 3 wherein the FET device comprises:
   a FET having a source, a drain, and a gate, the source coupled to the first port, the drain coupled to the second port, and the gate coupled to a first power supply operating at the second voltage level; and
   a diode having an anode and a cathode, the anode coupled to the first port, and the cathode coupled to the second port.

5. A bi-directional voltage translator according to claim 4 wherein the third voltage level is larger than the second voltage level.

6. A bi-directional voltage translator according to claim 1 wherein the switch circuit consists of:
   a FET having a source, a body, a drain, and a gate, the source coupled to the first port, the body coupled to an electrical ground, the drain coupled to the second port, and the gate coupled to a first power supply operating at the second voltage level.

7. A bi-directional voltage translator according to claim 1 further comprising:
   a first pull-up circuit coupled to the first port, the first pull-up circuit setting the first port to communicate the first signal at the second voltage level.

8. A bi-directional voltage translator according to claim 1 further comprising:
   a second pull-up circuit coupled to the second port, the second pull-up circuit setting the second port to communicate the second signal at the third voltage level.

9. A bi-directional voltage translator according to claim 1 wherein the switch circuit connects the first port and the second port responsive to a fourth voltage level at the first port, the fourth voltage level being no less than the first voltage level and no greater than the second voltage level.

10. A bi-directional voltage translator according to claim 1 wherein the switch circuit comprises:
    a first switch having a first terminal, a second terminal, and a third terminal, the first terminal coupled to the first port, and the third terminal coupled to a first power supply operating at the second voltage level; and
    a second switch having a fourth terminal, a fifth terminal, and a sixth terminal, the fourth terminal coupled to the second port, the fifth terminal coupled to the second terminal, and the sixth terminal coupled to the third terminal.

11. A bi-directional voltage translator according to claim 10 wherein the switch circuit comprises:
   a first diode having a seventh terminal and an eighth terminal, the seventh terminal coupled to the first port, and the eighth terminal coupled to the second terminal of the first switch; and
   a second diode having a ninth terminal and a tenth terminal, the ninth terminal coupled to the second port and the tenth terminal coupled to the fifth terminal of the second switch.

12. A bi-directional voltage translator according to claim 1 wherein the switch circuit comprises a first FET device and a second FET device, the first FET device comprising a first FET and a first diode, the first FET comprising a first source, a first drain, and a first gate, the first source coupled to the first port, the first gate coupled to a power supply operating at the second voltage level, the first diode comprising a first anode and a first cathode, the first anode coupled to the first port, the first cathode coupled to the first drain, the second FET device comprising a second FET and a second diode, the second FET comprising a second source, a second drain, and a second gate, the second source coupled to the second port, the second drain coupled to the first drain, the second gate coupled to the first gate, the second diode comprising a second anode and a second cathode, the second anode coupled to the second port, the second cathode coupled to the second drain.

13. A bi-directional voltage translator comprising:
   a first port to communicate a first signal at one of a first voltage level and a second voltage level;
   a second port to communicate a second signal at one of the first voltage level and a third voltage level, the third voltage level different from the second voltage level; and
   a FET device comprising a source and a drain, the source coupled to the first port, the drain coupled to the second port, the FET device, responsive to the first signal at the first voltage level and the second signal at the third voltage level, generating the second signal at the first voltage level, and the FET device, responsive to the second signal at the first voltage level and the first signal at the second voltage level, generating the first signal at the first voltage level.

14. A bi-directional voltage translator according to claim 13 wherein the FET device comprises a gate coupled to a power supply at the second voltage level.

15. A bi-directional voltage translator according to claim 13 further comprising:
   a first pull-up circuit coupled to the first port, the first pull-up circuit setting the first port to communicate the first signal at the second voltage level.

16. A bi-directional voltage translator according to claim 13 further comprising:

a second pull-up circuit coupled to the second port, the second pull-up circuit setting the second port to communicate the second signal at the third voltage level.

17. An accessory comprising:
   accessory circuitry operating at a first voltage level;
   a first port coupled to the accessory circuitry to communicate a first signal at one of the first voltage level and a second voltage level;
   a second port to connect to an electronic device, the second port to communicate a second signal at one of the second voltage level and a third voltage level, the third voltage level different from the first voltage level; and
   a switch circuit operably coupled to the first port and the second port, the switch circuit, responsive to the first signal at the second voltage level and the second signal at the third voltage level, communicating to the second port the second signal at the second voltage level, and the switch circuit, responsive to the second signal at the second voltage level and the first signal at the first voltage level, communicating to the first port the first signal at the second voltage level.

18. An accessory according to claim 17
   further comprising a power supply operating at the first voltage level, and
   wherein the switch circuit comprises a FET having a source, a gate, and a drain, the source coupled to the second port, the drain coupled to the accessory circuitry, and the gate coupled to the power supply.

19. An accessory according to claim 17 further comprising a pull-up circuit coupled to the first port, the pull-up circuit setting the first port to communicate the first signal at the first voltage level.

20. A bi-directional voltage translator comprising:
   a first port to communicate a first signal at one of a first voltage level and a second voltage level;
   a first pull-up circuit coupled to the first port to set the first port to communicate the first signal at the second voltage level;
   a second port to communicate a second signal at one of the first voltage level and a third voltage level;
   a second pull-up circuit coupled to the second port to set the second port to communicate the second signal at the third voltage level;
   a FET comprising a source and a drain, the source coupled to the first port, the drain coupled to the second port; and
   a diode integral to the FET, the diode comprising an anode and a cathode, the anode coupled to the first port, the cathode coupled to the second port, the bi-directional voltage translator, responsive to the first signal at the first voltage level, generating the second signal at the first voltage level, the bi-directional voltage translator, responsive to the second signal at the first voltage level, generating the first signal at the first voltage level.

* * * * *